United States Patent
Yang et al.

(10) Patent No.: US 6,452,225 B1
(45) Date of Patent: Sep. 17, 2002

(54) METHOD AND STRUCTURE OF ETCHING A MEMORY CELL POLYSILICON GATE LAYER USING RESIST MASK AND ETCHED SILICON OXYNITRIDE

(76) Inventors: Wenge Yang, 44668 Japala Pl., Fremont, CA (US) 94539; Lewis Shen, 10181 Western Dr., Cupertino, CA (US) 95014

( * ) Notice: Subject to any disclaimer, the term of this patent is extended or adjusted under 35 U.S.C. 154(b) by 0 days.

(21) Appl. No.: 09/617,820

(22) Filed: Jul. 17, 2000

Related U.S. Application Data

(62) Division of application No. 09/118,382, filed on Jul. 17, 1998, now Pat. No. 6,110,779.

(51) Int. Cl.[7] .............................................. H01L 29/788
(52) U.S. Cl. ..................... 257/315; 257/314; 257/315; 257/324; 257/410; 257/411; 438/257; 438/717; 438/724; 438/942; 438/950
(58) Field of Search ................................. 257/314, 315, 257/324, 410, 411; 438/257, 724, 717, 942, 950

(56) References Cited

U.S. PATENT DOCUMENTS

| | | | |
|---|---|---|---|
| 4,182,636 A | 1/1980 | Dennard et al. | |
| 4,192,059 A | 3/1980 | Khan et al. | |
| 4,231,051 A | 10/1980 | Custode et al. | |
| 4,869,781 A | 9/1989 | Euen et al. | |
| 5,028,557 A | 7/1991 | Tsai et al. | |
| 5,118,639 A | 6/1992 | Roth et al. | |
| 5,294,563 A | 3/1994 | Rao | |
| 5,496,750 A | 3/1996 | Moslehi | |
| 5,518,941 A | 5/1996 | Lin et al. | |
| 5,674,788 A | 10/1997 | Wristers et al. | |
| 5,977,601 A | * 11/1999 | Yang et al. | 257/437 |
| 5,998,827 A | * 12/1999 | Park | 257/315 |
| 6,027,998 A | * 2/2000 | Pham et al. | 438/633 |
| 6,034,395 A | * 3/2000 | Tripsas et al. | 257/316 |
| 6,063,662 A | * 5/2000 | Bui | 438/257 |
| 6,066,873 A | * 5/2000 | Wang et al. | 257/315 |
| 6,121,154 A | * 9/2000 | Haselden et al. | 438/724 |
| 6,166,419 A | * 12/2000 | Araki | 257/500 |

* cited by examiner

Primary Examiner—Jerome Jackson, Jr.
Assistant Examiner—Edgardo Ortiz

(57) ABSTRACT

A resist mask pattern having a reduced thickness is formed overlying on a silicon oxynitride film during formation of a memory gate. The resist mask pattern has a resist thickness (3000 to 4000 Angstroms) sufficient to withstand removal during etching of the silicon oxynitride film. The silicon oxynitride film, having a thickness of about 800 to 1500 Angstroms, is etched based on the resist mask pattern and then used as a mask pattern to etch the polysilicon gate layer underlying the silicon oxynitride layer, to expose a portion of an isolation region aligned relative to the resist mask pattern. The portion of the resist mask remaining after etching, in combination with the etched silicon oxynitride film, have a sufficient overall thickness to serve as a channel implant mask. Use of the resist mask pattern having the reduced thickness improves yield by minimizing the occurrence of misregistration, and enables reliable formation of spaces in the mask pattern having widths of less than 0.25 microns using conventional deep ultraviolet (DUV) photolithography techniques.

4 Claims, 3 Drawing Sheets

METHOD AND STRUCTURE OF ETCHING A MEMORY CELL POLYSILICON GATE LAYER USING RESIST MASK AND ETCHED SILICON OXYNITRIDE

This application is a Divisional of Ser. No. 09/118,382 filed Jul. 17, 1998 now U.S. Pat. No. 6,110,779.

BACKGROUND OF THE INVENTION

1. Technical Field

The present invention relates to semiconductor devices and manufacturing processes, and more particularly to methods and arrangements for etching a polysilicon gate layer in a memory device.

2. Background Art

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1A. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating ate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1B depicts a cross-section of several adjacent memory cells from the perspective of a cross-section through the word line (i.e., from perspective A, as referenced in FIG. 1A). In FIG. 1B, the cross-section reveals that individual memory cells are separated by isolating regions of silicon dioxide formed on substrate 12. For example, FIG. 1B shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric later 24 has been conformally deposited over the exposed portions of floating gates 16a–c and field oxides 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer.

The continued shrinking of the memory cells, and in particular the basic features depicted in the memory cells of FIGS. 1A–B, places a burden on the fabrication process to deposit and subsequently pattern a layer stack to form a floating gate/control gate structure, without creating deleterious effects within the resulting memory cells. Of particular concern, is the need to control the deposition and patterning processes associated with the layer stack. In particular, there is a concern of providing accurate alignment to minimize the risk of introducing impurities into a substrate during channel implant.

FIGS. 2A and 2B are diagrams summarizing a conventional technique of forming the floating gate 16, viewed from a word line cross-section. As shown in FIG. 2A, the polysilicon layer 16 is etched to form the floating gates 16a, 16b, and 16c by depositing a layer of photoresist 40 overlying on the polysilicon layer 16 to a thickness of about 9700 Angstroms (A). The deposited photoresist layer 40 is then patterned using conventional deep ultraviolet (DUV) photolithography techniques to form spaces 42. The polysilicon layer 16 typically has a thickness of about 900 Angstroms. The patterned resist layer 40 having the spaces 42 is used as a mask for etching the polysilicon layer 16, resulting in the structure of FIG. 2B having the etched polysilicon layer 16a, 16b, and 16c. The spa ($S_1$) of the exposed region 50 of the field oxide 14a equals the limit of current DUV photo lithography techniques, around 0.24 microns.

Following etching of the polysilicon layer 16, the resist mask pattern 44 loses about 100 to 200 Angstroms of resist during the polysilicon etch. The resist mask pattern 44' is then used as an implant mask during implantation of impurities 46 into the exposed regions 48 of the etched polysilicon layer 16a, 16b, and 16c.

As shown in FIG. 2B, some of the impurities 46 are implanted into the resist layer 44'. Hence, the resist layer 40 must have sufficient thickness (e.g., 9700 Angstroms) to protect the non-exposed portions of the semiconductor wafer. Hence, the resist mask pattern 44', when properly aligned with the center of the isolation region 14a and 14b, causes the impurities 46 to be implanted only into the exposed regions 48 of the polysilicon layer 16, and the exposed portion 50 of the isolation region 14.

A primary concern is that the resist mask pattern 44' is properly aligned with the isolation region 14 to prevent the impurities 46 from entering the active region 52 of the substrate 12, which is bounded by the isolation regions 14a and 14b. Since the implant of impurities 46 is a relatively high energy implant, it is desirable to use the combination of the polysilicon layer 16 and the resist layer 42 block the impurities from entering the active region 52. However, if misregistration occurs such that the mask pattern is not properly overlaid with the isolation region 14b. illustrated in FIG. 2B as the dotted pattern line 44", the impurities may enter the source/drain active region 52 due to misregistration (i.e., misalignment) of the resist mask pattern 44".

The use of the thick resist layer 40 having a thickness of about 9700 Angstroms causes alignment problems in that the process margin for properly overlaying the resist mask pattern 44 with the isolation region 14 is very small. Hence the masking process may need to be performed two to three times per lot in order to attain the appropriate overlay. The spacing ($S_1$) is also limited to no less than 0.25 microns since the formation of small spaces using a thick resist layer 40 is relatively difficult.

SUMMARY OF THE INVENTION

There is a need for an arrangement for etching a polysilicon gate layer during formation of a channel implant mask that improves yield and process margins by reducing the necessary thickness of the photoresist mask pattern.

There is also a need for an arrangement for obtaining improved resolution during photolithography, enabling formation of a resist mask pattern having reduced width spaces for formation of a channel implant mask.

These and other needs are obtained by the present invention, where a resist mask pattern having a reduced thickness is formed overlying on a film containing silicon and nitrogen, where the film is overlying on the polysilicon gate layer. The resist mask pattern has a resist thickness sufficient to withstand removal during etching of the film. Once the film is etched based on the resist mask pattern, the etched film is used as a mask pattern to etch the polysilicon gate layer to expose a portion of the isolation region aligned relative to the resist mask pattern. The portion of the resist mask remaining after etching in combination with the etched film have a sufficient overall thickness to serve as a channel implant mask, used to implant only the exposed portion of the etched polysilicon gate layer with a channel implant impurity.

According to one aspect of the present invention, a method of etching a polysilicon gate layer for a memory cell, the polysilicon gate layer overlying an isolation region and a substrate region comprises depositing a film containing silicon and nitrogen overlying on the polysilicon gate layer, forming a resist mask pattern overlying on the film, exposing the film at a region corresponding to at least a portion of the isolation region, and having a resist thickness sufficient to withstand removal during etching of the film, etching the film based on the resist mask pattern, and etching the polysilicon gate layer and exposing the portion of the isolation region based on the etched film. The formation of a resist mask having a resist thickness sufficient to withstand removal during etching of the film reduces the thickness requirements of the resist mask pattern compared to prior techniques that required the resist thickness to be sufficient to serve as an implant mask. Hence, the resist mask pattern having the reduced thickness relative to the prior art improves process tolerances and process margins for aligning the resist mask pattern with the isolation region. Moreover, the use of a reduced thickness resist mask pattern improves the process margins for formation of small spaces in the resist mask pattern for exposing underlying, regions.

Another aspect of the present invention provides a method of forming an implant mask for a polysilicon gate layer for a memory cell, the method comprising depositing a layer of silicon oxynitride overlying on the polysilicon gate layer, forming a resist mask pattern on the silicon oxynitride layer having a thickness of up to about 4000 Angstroms and a space of less than about 0.25 microns, etching the silicon oxynitride layer based on the resist mask pattern, and etching the polysilicon gate layer based on the etched silicon oxynitride region. Use of silicon oxynitride improves the process margins for the resist mask pattern based on the antireflective coating properties of the layer of silicon oxynitride. Moreover, the silicon oxynitride is used in combination with the resist mask pattern as a channel implant mask, enabling the resist mask pattern to have a thickness of up to about 4000 Angstroms, substantially less than conventionally used in the prior art.

Still another aspect of the present invention provides a semiconductor structure formed during fabrication of a memory cell, comprising an isolation region formed on a prescribed region of a semiconductor substrate, a polysilicon layer formed overlying on the isolation region and the semiconductor substrate, a film layer containing silicon and nitrogen overlying on the polysilicon gate layer, and a resist mask pattern overlying on the film layer and having a thickness of up to about 4000 Angstroms, the resist mask pattern having a spaced opening substantially aligned with a center of the prescribed region and having a width of less than about 0.25 microns, the spaced opening for exposing the isolation region at the center of the prescribed region during etching of the film layer and the polysilicon layer. The film layer reduces the thickness requirements of the resist mask patterns by its contribution to the formation of a channel implant mask. In addition, the film layer may be implemented as an antireflective coating layer, for example silicon oxynitride, that improves the process margins of the photolithography processes used to form the resist mask pattern. Hence, the film layer enables the resist mask pattern to have a thickness of up to about 4000 Angstroms, which substantially improves process margins in photolithography, thereby ensuring reliability in formation of a spaced opening having a width of less than about 0.25 microns and substantially aligned with a center of a prescribed region.

Additional objects, advantages and novel features of the invention will be set forth in part in the description which follows, and in part will become apparent to those skilled in the art upon examination of the following or may be learned by practice of the invention. The object and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 3A:
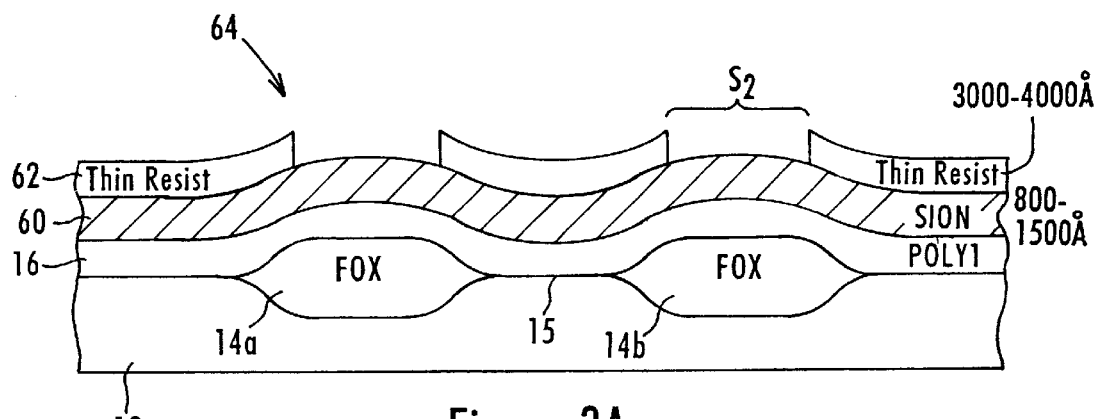
FIGS. 3A, 3B, 3C, and 3D are diagrams summarizing a method of etching a polysilicon gate layer and channel implanting the etched polysilicon gate layer according to an embodiment of the present invention.

FIGS. 3A–3D are diagrams summarizing a method for forming a mask for etching the polysilicon layer 16, and for performing a channel implant for a memory cell according to an embodiment of the present invention. According to the disclosed embodiment a film 60 containing silicon and nitrogen is deposited overlying on the polysilicon gate layer 16 to a thickness of about 800 to 1500 Angstroms, as shown in FIG. 3A. According to the disclosed embodiment, the deposited film 60 is composed of silicon oxynitride (e.g., $SiO_xN_y$, where x and y represent the atomic percentage of oxygen and nitrogen respectively). Silicon oxynitride is effective as an antireflective coating (ARC) layer, and provides increased patterning resolution control during subsequent photolithography masking processes. As described below, the etched silicon oxynitride layer 60 also helps block the channel stop implant. Hence, the silicon oxynitride layer 60 provides better resolution during the lithography process, and also helps serve as a channel implant mask during implantation.

An alternative to silicon oxynitride as the film 60 includes silicon nitride ($Si_3N_4$), and silicon oxime (e.g., $Si_{1-(x+y+z)}N_xO_y:H_z$, wherein x, y and z represent the atomic percentage of nitrogen, oxygen, and hydrogen, respectively). However, silicon oxynitride has a faster rate of deposition using conventional chemical vapor deposition (CVD) techniques, has a higher throughput, and requires a lower temperature.

A thin layer of resist 62 is then deposited overlying on the silicon oxynitride film 60 to a thickness of about 3000 to 4000 Angstroms. The thickness of the resist pattern 62 is at least sufficient to withstand removal during etching of the silicon oxynitride film layer 60 to ensure that the resist mask pattern 64, formed using DUV lithography techniques, is transferred to the silicon oxynitride layer 60. Hence, the reduced thickness of the resist layer 62 enables the alignment of the mask pattern 64 to be more easily controlled, and also enables the reliable formation of smaller spaces $S_2$ having widths of less than 0.24 microns due to the improved depth of field resolution obtained using the reduced-thickness resist layer 62. The use of silicon oxynitride as an antireflective coating layer 60 also improves the resolution for the masking process, optimizing conditions for photolithography and improving process margins for increased yield.

Figure 3B:
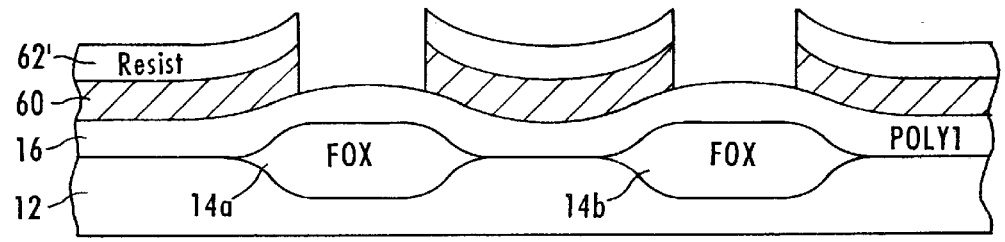

Following formation of the resist mask pattern 64 in FIG. 3A, the silicon oxynitride layer 60 is etched to form the structure of FIG. 3B. The silicon oxynitride layer 60 is etched in a decoupled plasma source (DPS) poly chamber, for example as available from Applied Materials Inc., in an etch environment including $CHF_3$, $CF_4$ and $O_2$. The resist layer 62 loses approximately 2.500 Angstroms of resist during etching of the silicon oxynitride layer 60.

Figure 3C:
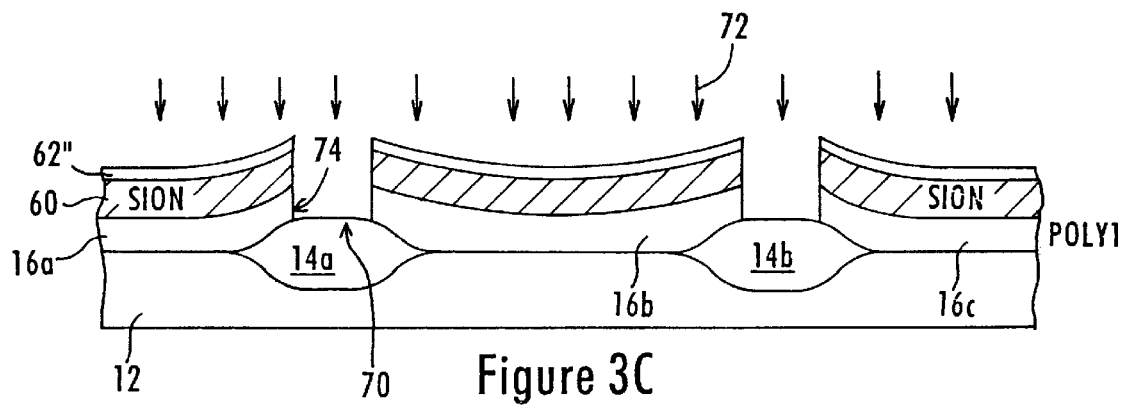

Once the silicon oxynitride layer 60 has been etched, exposing the polysilicon layer 16, the polysilicon gate layer 16 is then etched based on the etched silicon oxynitride film layer 60 in FIG. 3B to expose a portion of the isolation region 14 based on the self-aligned etching using the etched silicon oxynitride film 60. As shown in FIG. 3C, the self aligned etching of the polysilicon gate layer 16 exposes at least a portion of 70 of the isolation region 14 substantially aligned with the center of the isolation region 14, and has a width of about less than 0.24 microns. Hence, the use of a thinner resist layer 62 during photolithography enables more accurate alignment with the center of the isolation regions 14. As shown in FIG. 3C, the residual layer of resist 62' loses approximately 500 Angstroms during etching of the polysilicon layer, preferably in the DPS poly chamber in a poly tech environment including $CL_2$, HBr, and $HE-O_2$ followed by a poly one layer over-etch using HBr.

Figure 3D:
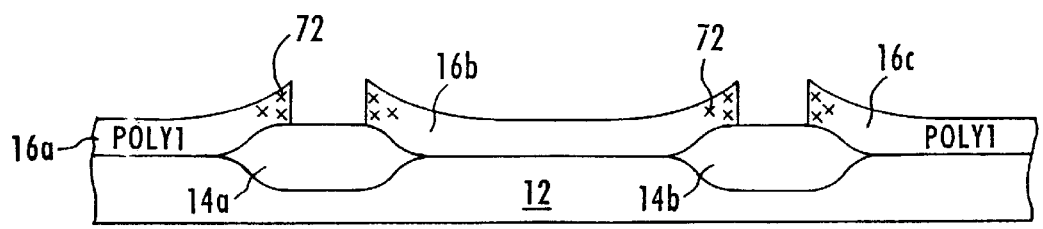

Hence, although the etching has removed a total of 3,000 Angstroms from the original resist thickness and resist layer 62 resulting in resist layer 62", the thickness of the resist layer 62" and the etched silicon oxynitride layer 60 is sufficient to effectively block the bombardment of impurities 72 during channel stop implant. Hence, the channel implant mask including the residual resist layer 62" and the etched silicon oxynitride film 60 provides reliable implantation of the impurities 72 into the exposed regions 74 of the etched polysilicon layer 16. Hence, the implantation of impurities 72 can be reliably limited to the exposed regions 74 of the polysilicon layer 16, as shown in FIG. 3D.

Figure 1A:
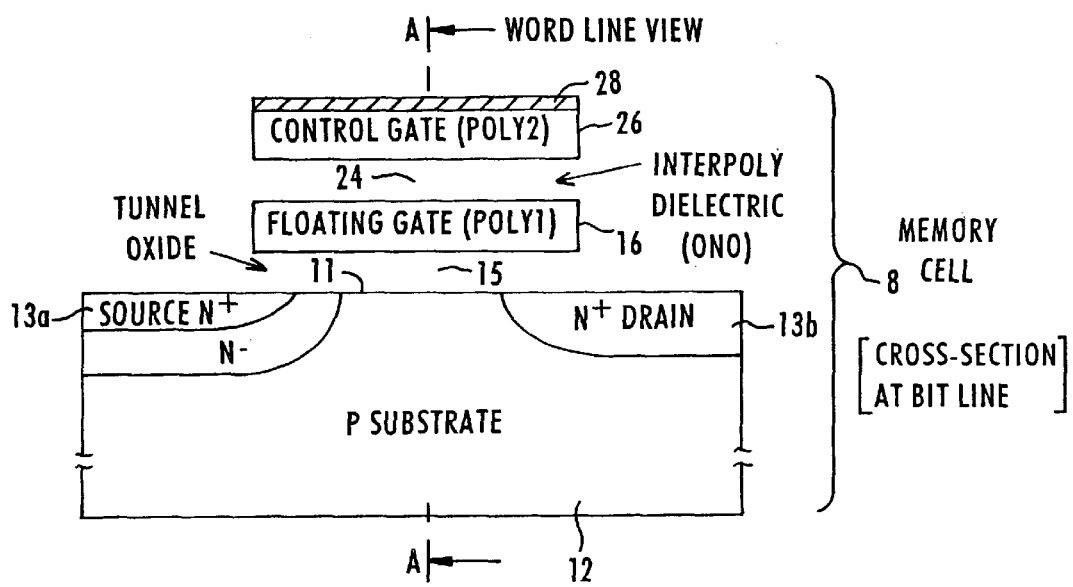
FIGS. 1A and 1B are diagrams illustrating cross sectional views of a prior art semiconductor memory device having at least one memory cell, as bit-line views and word-line views, respectively.
Figure 1B:
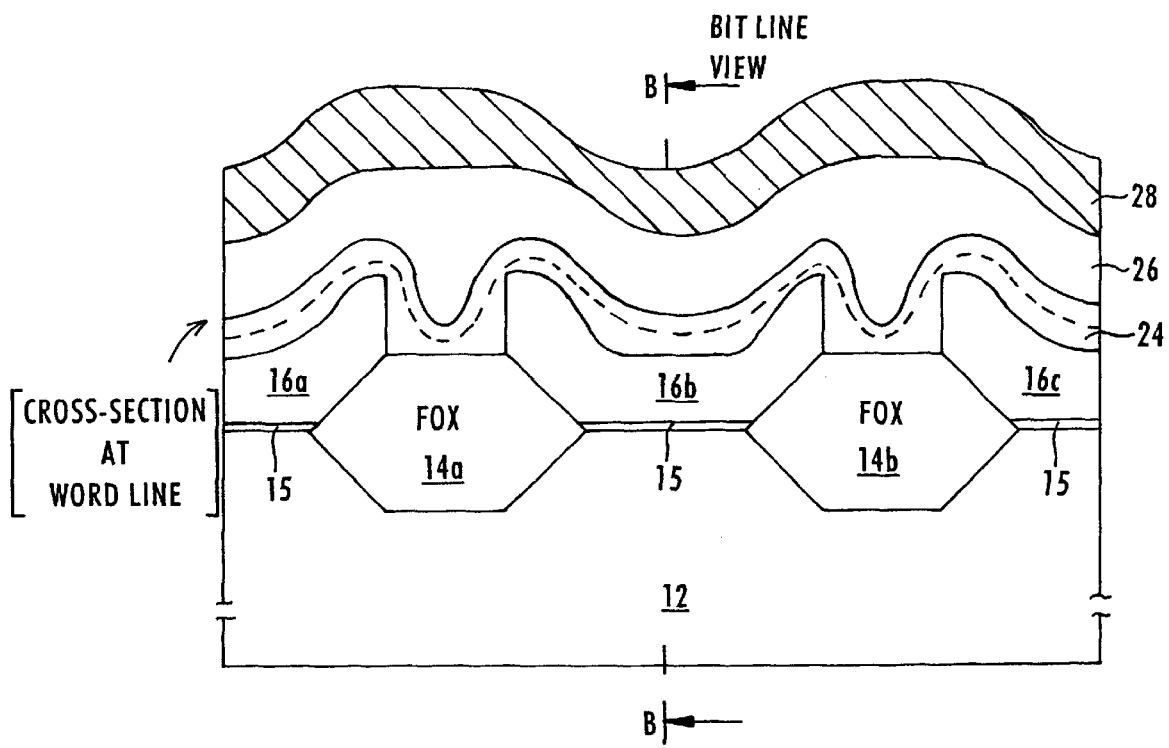
Figure 2A:
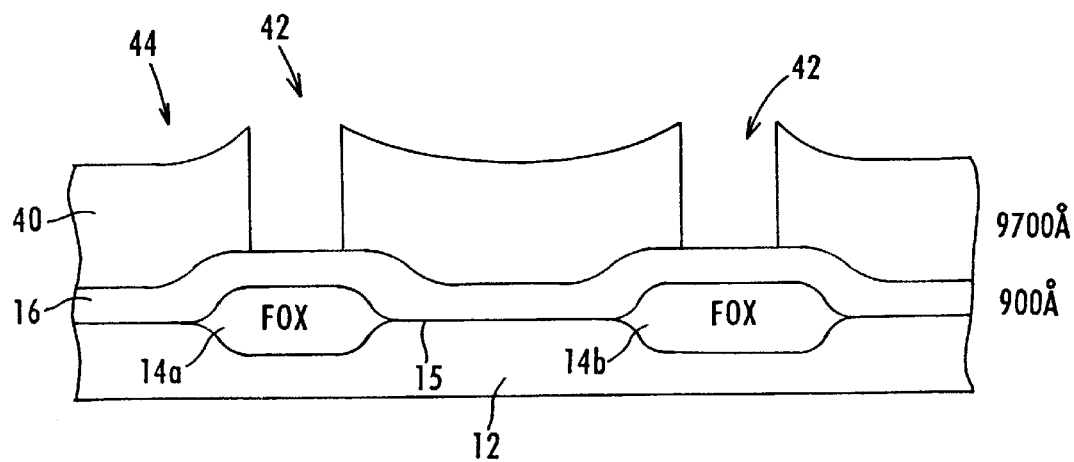
FIGS. 2A and 2B are diagrams summarizing a prior art method for performing a channel implant, showed along the word-line view.
Figure 2B:
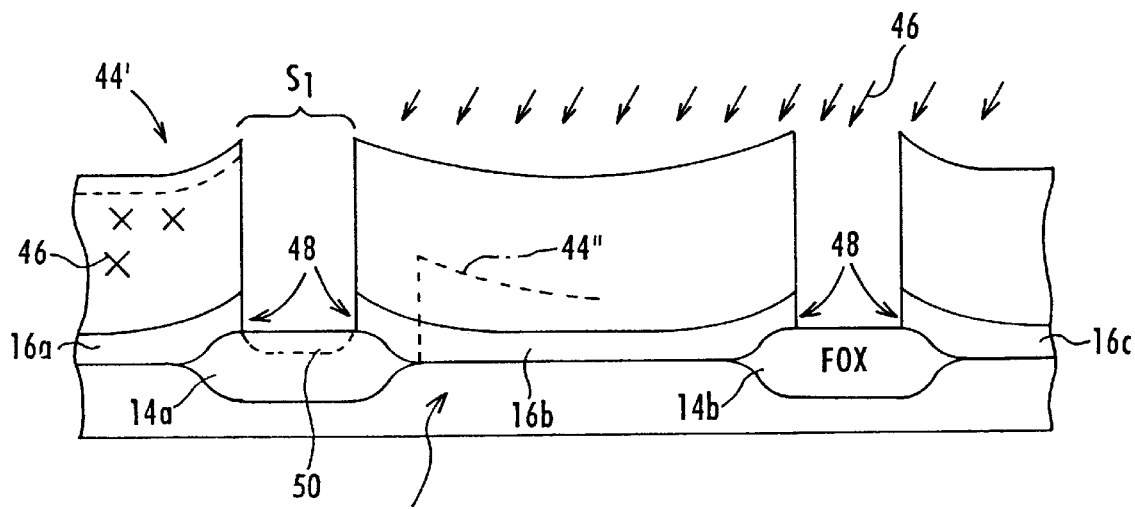
Figure 4:
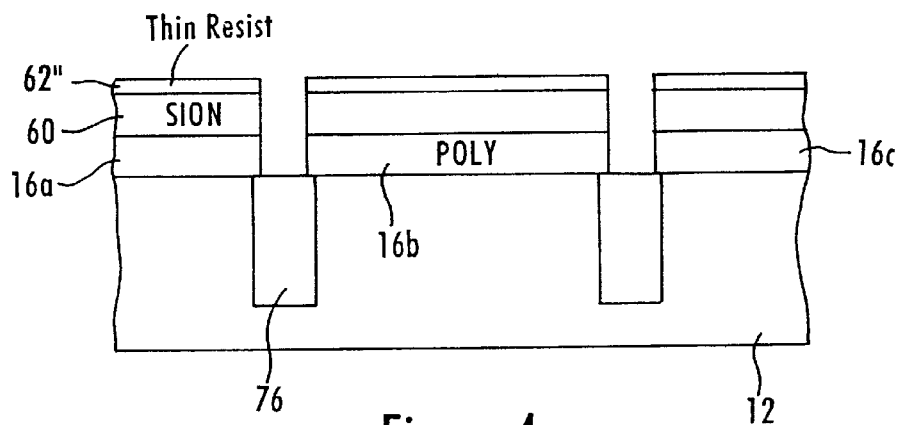
FIG. 4 is a diagram illustrating an alternative semiconductor structure formed during fabrication of the memory cell having transisolation regions.

Although FIG. 3C discloses the isolation regions 14a and 14b as field oxidized regions, the structure may alternatively use trench isolation structures 76, as shown in FIG. 4.

Hence, the disclosed embodiment enables more reliable channel implant by using a film 60, for example a silicon oxynitride mask, in order to reduce the necessary thickness of the resist layer 62. Hence, the lithography process has an improved process margin, improving the reliability in aligning the resist mask 74 to the center region 70 of the isolation region 14. In addition, a greater resolution is achieved, enabling the reliable formation of spaces $S_2$ having a width of less than 0.24 microns using conventional DUV photolithography techniques.

While this invention has been described in connection with what is presently considered to be the most practical and preferred embodiment, it is to be understood that the invention is not limited to the disclosed embodiment, but on the contrary, is intended to cover various modifications and equivalent arrangements included within the spirit and scope of the appended claims.

What is claimed is:

1. A semiconductor structure formed during fabrication of a memory cell, comprising:

an isolation region formed on a prescribed region of a semiconductor substrate;

a polysilicon layer formed overlying on the isolation region and the semiconductor substrate;

a film layer containing silicon and nitrogen overlying on the polysilicon gate layer; and a resist mask pattern overlying on the film layer and having a thickness of up to about 4000 Angstroms, the resist mask pattern having a spaced opening substantially aligned with a center of the prescribed region and having a width of less than about 0.25 microns, the spaced opening for exposing the isolation region at the center of the prescribed region during etching of the film layer and the polysilicon layer.

2. The semiconductor structure of claim 1, wherein the film layer is silicon oxynitride and has a thickness of up to 1500 Angstroms.

3. The semiconductor structure of claim 2, wherein the thickness of the silicon oxynitride layer is between and including about 800 to 1500 Angstroms.

4. The semiconductor structure of claim 1, wherein the thickness of the resist mask pattern is between and including about 3000 to 4000 Angstroms.

* * * * *

UNITED STATES PATENT AND TRADEMARK OFFICE
CERTIFICATE OF CORRECTION

PATENT NO. : 6,452,225 B1
DATED : September 17, 2002
INVENTOR(S) : Wenge Yang et al.

It is certified that error appears in the above-identified patent and that said Letters Patent is hereby corrected as shown below:

<u>Title page,</u>
Please insert -- [73] Assignee: Advanced Micro Devices, Inc, Sunnyvale, CA (US) --

Signed and Sealed this

Twenty-second Day of July, 2003

JAMES E. ROGAN
*Director of the United States Patent and Trademark Office*